(12) United States Patent
Cheng et al.

(10) Patent No.: US 6,969,648 B2
(45) Date of Patent: Nov. 29, 2005

(54) METHOD FOR FORMING BURIED PLATE OF TRENCH CAPACITOR

(75) Inventors: Kangguo Cheng, Beacon, NY (US); Ramachandra Divakaruni, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 91 days.

(21) Appl. No.: 10/604,081

(22) Filed: Jun. 25, 2003

(65) Prior Publication Data

US 2005/0009268 A1    Jan. 13, 2005

(51) Int. Cl.[7] ................... H01L 21/8242; H01L 21/20
(52) U.S. Cl. .................... 438/249; 438/246; 438/389; 438/392
(58) Field of Search ................ 438/243–249, 438/386–392; 257/301–302

(56) References Cited

U.S. PATENT DOCUMENTS

| | | | |
|---|---|---|---|
| 6,008,103 A * | 12/1999 | Hoepfner | 438/386 |
| 6,177,696 B1 * | 1/2001 | Bronner et al. | 257/301 |
| 6,190,988 B1 | 2/2001 | Furukawa et al. | |
| 6,200,873 B1 * | 3/2001 | Schrems et al. | 438/386 |
| 6,225,158 B1 | 5/2001 | Furukawa et al. | |
| 6,232,171 B1 * | 5/2001 | Mei | 438/246 |
| 6,297,088 B1 | 10/2001 | King | |
| 6,319,788 B1 | 11/2001 | Gruening et al. | |
| 6,365,485 B1 | 4/2002 | Shiao et al. | |
| 6,437,401 B1 | 8/2002 | Mandelman et al. | |
| 6,495,411 B1 | 12/2002 | Mei | |
| 6,509,599 B1 | 1/2003 | Wurster et al. | |
| 6,706,587 B1 * | 3/2004 | Tsai et al. | 438/243 |
| 6,727,541 B2 * | 4/2004 | Nishikawa | 257/301 |
| 2001/0012215 A1 | 8/2001 | Furukawa et al. | |
| 2001/0016398 A1 * | 8/2001 | Kudelka et al. | 438/427 |

OTHER PUBLICATIONS

Kotz et al., Chemistry and Chemical Reactivity, Second Edition, Saunders College Publishing, 1991, p. 150.*

* cited by examiner

*Primary Examiner*—Jennifer M. Kennedy
(74) *Attorney, Agent, or Firm*—Steve Capella

(57) ABSTRACT

A method for forming a buried plate in a trench capacitor is disclosed. The trench is completely filled with a dopant source material such as ASG. The dopant source material is then recessed and the collar material is deposited to form the collar in the upper portion of the trench. After drive-in of the dopants to form the buried plate, the dopant source material is removed and the collar materials may be removed.

26 Claims, 7 Drawing Sheets

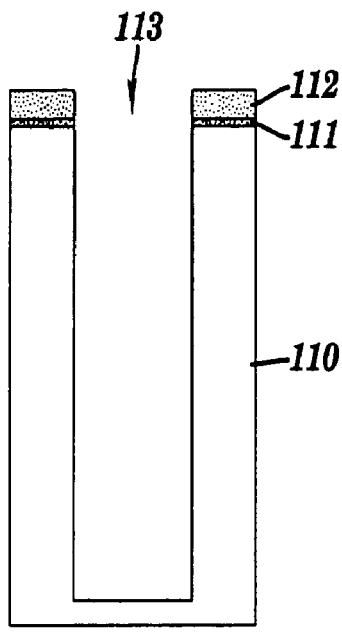
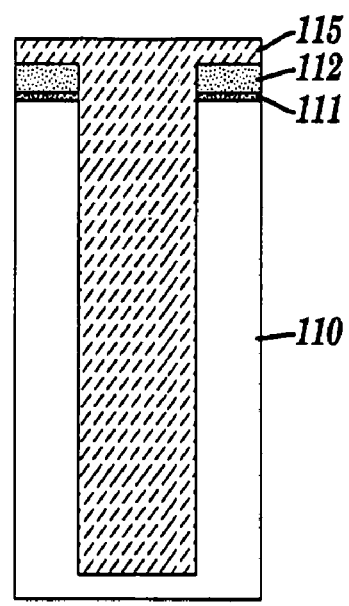
FIG. 3(a)   FIG. 3(b)
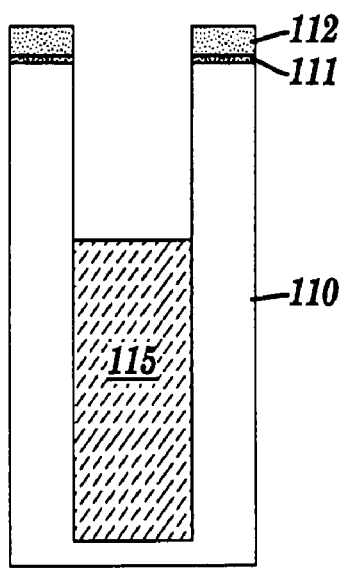
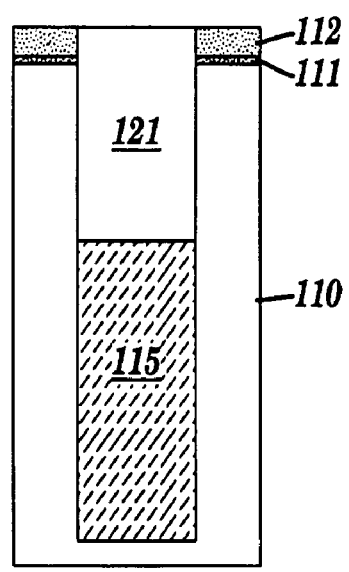
FIG. 3(c)   FIG. 3(d)

METHOD FOR FORMING BURIED PLATE OF TRENCH CAPACITOR

BACKGROUND OF INVENTION

This invention relates to integrated circuits (ICs) in general, and more particularly to trench capacitors. Such ICs include, for example, memory ICs such as random access memories (RAMs), dynamic RAMS (DRAMs), synchronous DRAMs (SDRAMs), static RAMs (SRAMs), and read only memories (ROMs) or other memory ICs. Other ICs include devices such as programmable logic arrays (PLAs), applications specific ICs (ASICs), merged logic/memory ICs (embedded DRAMs, or eDRAMs), or any circuit devices utilizing trench capacitors. Specifically, this invention relates to a new method for forming a buried plate in a trench capacitor, particularly a deep trench capacitor.

Integrated circuit (ICs) or chips employ capacitors for charge storage purposes. An example of an IC that employs capacitors for storing charge is a memory IC, such as a DRAM chip. Typically, a DRAM memory cell comprises a transistor connected to a capacitor. One type of capacitor that is commonly employed in DRAMs is the trench capacitor. A trench capacitor is a three-dimensional structure formed in the substrate, and typically comprises a deep trench etched into the substrate. The trench is filled, for example, with n-type doped poly. The doped poly serves as one electrode of the capacitor (referred to as the "storage node"). An n-type doped region surrounds the lower portion of the trench, serving as a second electrode. The doped region is referred to as a "buried plate." A node dielectric separates the buried plate and the storage node.

Formation of the buried plate is an important part of the process for trench DRAM technology to improve the device performance. A conventional technique for forming the buried plate includes outdiffusing dopants into the region of the substrate surrounding the power portion of the trench. The dopant source is typically provided by an n-type silicate glass such as, for example, arsenic doped silicate glass (ASG). The buried plate is conventionally formed by deposition of a thin layer of ASG on the sidewalls of the lower trench followed by thermal anneal, known as the "drive-in" process. The ASG layer acts as an arsenic source to dope the buried plate.

As the feature size of trench technology decreases, especially as the trench size shrinks, the thickness of the ASG layer must be reduced accordingly. However, excessive reduction of ASG thickness causes lower arsenic concentration in the buried plate region because of the depletion of arsenic in the thin ASG layer. Lower arsenic concentration degrades device performance. Therefore, scaling of trench technology is severely constrained by the conventional ASG process.

A collar is also imperative for both buried plate and capacitance enhancement because it acts as a hardmask to block arsenic diffusion and silicon etching on the trench top portion. Conventionally, the collar is formed before deposition of the ASG. Several collar schemes have been developed, including the anti-collar scheme, the sacrificial poly scheme and the modified anti-collar scheme, but each of them has its inherent limitations.

In the anti-collar scheme, an oxide layer is formed first on the trench sidewall. Then the trench is filled with resist, and the top surface of the resist is recessed to a predetermined depth below the top of the trench. The oxide is removed from the exposed sidewalls in the top portion of the trench, then the resist in the lower portion of the trench is stripped. This leaves only the bottom portion of the trench sidewalls covered by oxide. Next, the wafer is exposed to a nitrogen-containing atmosphere, such as $NH_3$. A thin layer of nitride is thermally grown only on the top portion of the trench sidewalls, because the bottom portion is covered by the oxide. Lastly, the oxide is removed from the bottom portion of sidewalls, leaving a nitride collar on the top portion only.

An inherent limitation of the anti-collar scheme is that the maximum nitride thickness by thermal growth is only about 25 Å or less, which is not sufficient to act as a collar for subsequent processing.

The sacrificial poly scheme begins with formation of a first oxide layer on the trench sidewall typically by thermal oxidation. A first nitride layer is then formed on the trench sidewall by low pressure chemical vapor deposition (LPCVD). The trench is then filled with polysilicon, and the top surface of the poly is recessed to a predetermined depth below the top of the trench. Using in-situ steam growth (ISSG), the poly and nitride surfaces are oxidized, and then a second layer of nitride is deposited by LPCVD. Anisotropic etch by reactive ion etching (RIE) is then used to remove the nitride and ISSG oxide on the poly, while leaving the nitride and ISSG oxide on the trench sidewall. An aggressive etch follows in order to remove all of the poly in the trench bottom portion. The first nitride layer on the trench bottom is then stripped, stopping on the first oxide layer. Simultaneously, the second nitride layer on the trench top portion is stripped. The first oxide layer on the trench bottom portion and ISSG oxide on the trench top portion are then stripped, leaving a collar formed on the trench top portion only. The collar includes a thin layer of oxide and a layer of nitride.

Unlike the anti-collar scheme in which the nitride collar is formed by thermal growth, the nitride in the sacrificial poly scheme is formed by LPCVD. Therefore, the nitride in the sacrificial poly scheme may be any thickness. This scheme, however, suffers from a couple of disadvantages: process complexity, and severe defect generation during poly removal from the trench bottom. The removal process is a very aggressive etch process in order to completely remove the polysilicon. This may cause severe defect issues such as pinholes on the trench sidewall and damage on some areas such as alignment marks.

In the modified anti-collar scheme, a first oxide layer is formed on the trench sidewalls by thermal growth. Then, a first nitride layer is formed on the trench sidewall by LPCVD. A second oxide layer is next formed on the trench sidewall by LPCVD. A thin layer of polysilicon is deposited on the trench sidewall by LPCVD, and then its surface is oxidized to form a third oxide layer. The trench is then filled with resist, and the top surface of the resist is recessed to a pre-determined depth below the top of the trench. The third oxide layer is removed from the exposed top portion of the trench sidewall, then the resist is stripped. A second nitride layer is formed on the trench top portion only by thermal nitridation. The bottom portion of the trench is covered by the third oxide, thereby inhibiting nitride growth on the trench bottom portion. The third oxide is then stripped from the trench bottom portion, using a removal process which is selective to the second nitride layer. The poly is then stripped from the trench bottom portion, using a removal process which is selective to the second nitride layer. The first nitride layer is then stripped from the trench bottom portion, stopping on the first oxide layer. Simultaneously, the second nitride layer on the trench top portion is stripped, stopping on the poly layer. The poly layer is then stripped from the trench top portion. The first oxide layer is then stripped from the trench bottom portion. Simultaneously, the second oxide layer on the trench top is stripped. A collar is thereby formed on the trench top portion only. Similar to the sacrificial poly scheme, the collar includes a thin layer of oxide and a layer of nitride.

The advantage of the modified anti-collar scheme is that it avoids the aggressive poly removal step. However, disadvantages include: process complexity, and poor quality of the collar with "pinholes" because of the quality of the thin films. The multiple layers of film deposition may cause a high defect density in the nitride collar. This scheme also suffers possible pinch-off in narrow trenches.

Moreover, the bottle shape of the trench is formed before the buried plate in all of these schemes. The collar is possibly broken during the bottle process, leading to its ineffectiveness for the subsequent buried plate formation process.

For example, the collar may be formed on the upper sidewalls of the trench using a sacrificial material in the lower region of the trench. In U.S. Pat. No. 6,509,599, polysilicon 152 is deposited over the wafer in order to fill the trench 108 (col. 6, lines 16–17). The polysilicon 152 is then removed down to the bottom side of the collar to be formed (col. 6, lines 27–28). A dielectric layer is then deposited over the wafer, covering the trench sidewalls (col. 6, lines 41–42). The dielectric layer is etched in order to form the collar 168 (col. 7, lines 1–3). Then, the polysilicon sacrificial layer 152 is removed (col. 7, lines 12–13). After the polysilicon has been removed, the buried plate is formed (col. 7, lines 58–60). A similar process utilizing polysilicon as the sacrificial material is described in U.S. Pat. No. 6,319,788.

Alternatively, an oxide material may be used as the sacrificial material. In U.S. Pat. No. 6,297,088, an oxide layer 112 is formed on the substrate 102 and into the trench structure 110, then an etching back step is performed to remove the oxide 112 above the top surface of substrate 102 and a portion of oxide 112 from the trench, thereby exposing upper sidewalls 111$a$ (col. 4, line 63 col. 5, line 7). Collar nitride spacers 116 are next formed on the upper sidewalls 111$a$ (col. line 22–24). Then, oxide 112 is removed (col. 5, lines 37–40), and doped areas 117 are formed in the bottom 110$b$ and the lower sidewalls 111$b$ of the trench structure (col. 5, lines 48–49). A similar process utilizing a sacrificial dielectric material is described in U.S. Pat. No. 6,365,485.

In the methods described above, the deep trench is fully formed in the substrate, and then a sacrificial material is deposited into the trench and recessed to expose an upper portion of the trench sidewalls. The collar is formed on the upper sidewalls, the sacrificial material is removed, and the buried plate is formed in the lower portion of the trench. In an alternative method, the deep trench is partially formed, the collar is formed on the sidewalls of the partial trench, the complete trench is then etched, and the buried plate is formed in the trench sidewalls below the collar. For example, in U.S. Pat. No. 6,225,158, upper portion 39 of the deep trench is lined with nitride collar 43 (col. 3, lines 3–6), then etching of the deep trench is completed (col. 3, lines 10–13). The deep trench is lined with ASG 49, and drive-in forms an n+ diffusion plate 51 surrounding the lower portion 47 of the deep trench (col. 3, lines 14–20). A similar process is described in U.S. Pat. No. 6,190,988.

Again, in all of these schemes, the bottle is formed before the buried plate. The collar is possibly broken during the bottle process, leading to its ineffectiveness for the subsequent buried plate formation process. Moreover, the buried plate is formed by deposition of a thin layer of ASG on the sidewalls of the lower trench followed by thermal anneal, known as the "drive-in" process. As the feature size of trench technology decreases, especially as the trench size shrinks, excessive reduction of ASG thickness causes lower arsenic concentration in the buried plate region because of the depletion of arsenic in the thin ASG layer, thereby degrading device performance. Therefore, scaling of trench technology is severely constrained by the conventional ASG process.

Therefore, there remains a need in the art for a method of forming a buried plate in a trench capacitor which does not rely on deposition of a thin layer of a dopant source film on the sidewalls of the trench, and which also does not rely on formation of the collar structure prior to deposition of the dopant source material.

SUMMARY OF INVENTION

It is therefore an object of this invention to provide a method for forming a buried plate in a trench capacitor which overcomes the limitations of the prior art methods. Specifically, in the method of this invention, the trench is completely filled with the dopant source material such as ASG, and the dopant source material is then recessed. In one aspect of the invention, the collar material is then deposited to form the collar in the upper portion of the trench. Thus, the collar is formed after the dopant source material fill.

In one aspect of the invention, the method comprises the steps of: forming at least one trench with a sidewall in a semiconductor substrate; partially filling the trench with a dopant source material to form a dopant source having a top surface below a top of the trench, the dopant source material containing at least one dopant; forming a dielectric collar on the sidewall of the trench above the dopant source; heating the substrate to cause the dopant to diffuse into the substrate in the trench not covered by the dielectric collar, thereby forming the buried plate; and removing the dopant source material from the trench.

In another aspect of the invention, the method comprises the steps of: forming at least one trench with a sidewall in a semiconductor substrate; partially filling the trench with a dopant source material to form a dopant source having a top surface below a top of the trench, the dopant source material containing at least one dopant; depositing a second material on the dopant source, thereby filling the remainder of the trench and covering the sidewall of the trench above the dopant source; heating the substrate to cause the dopant to diffuse into the substrate in the trench not covered by the second material, thereby forming the buried plate; and removing the second material and the dopant source material from the trench.

The trench may be partially filled by a method comprising the steps of: filling the trench with a dopant source material to form a dopant source having a top surface at or above the top of the trench; andrecessing the top surface of the dopant source below the top of the trench.

BRIEF DESCRIPTION OF DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows, taken in conjunction with the accompanying drawings, in which:

FIGS. 3(a)–3(e) illustrate another embodiment of the method of this invention for forming a buried plate in a trench capacitor.

DETAILED DESCRIPTION

The invention will now be described by reference to the accompanying figures. In the figures, various aspects of the structures have been shown and schematically represented in a simplified manner to more clearly describe and illustrate the invention. For example, the figures are not intended to be drawn to scale. In addition, the vertical cross-sections of the various aspects of the structures are illustrated as being rectangular in shape. Those skilled in the art will appreciate, however, that with practical structures these aspects will most likely incorporate more tapered features. Moreover, the invention is not limited to constructions of any particular shape.

For purposes of discussion, this invention is described in the context of a DRAM cell. However, the invention extends to formation of trench capacitors in general. To better understand the invention, a description of a conventional process for forming a trench capacitor DRAM cell is provided.

Figure 1A:
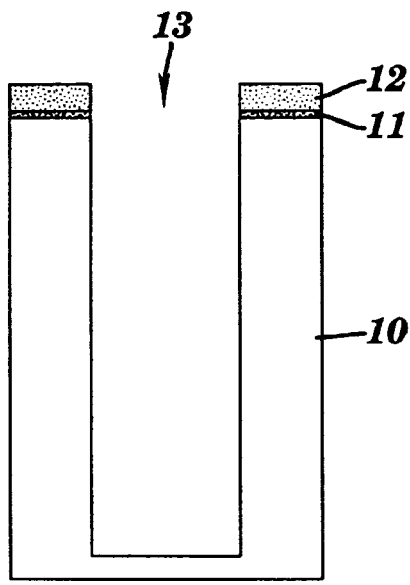
FIGS. 1($a$)–1($i$) illustrate a prior art method of forming a buried plate in a trench capacitor.
Figure 1B:
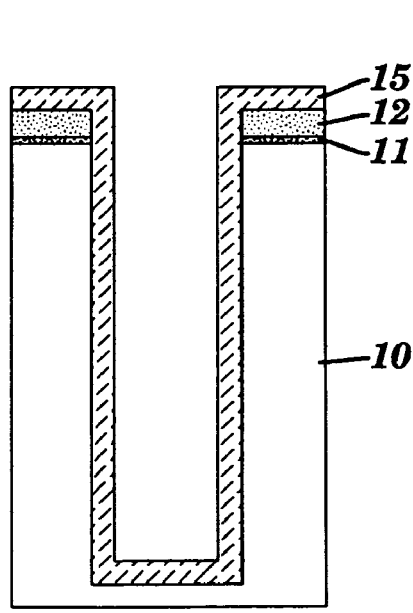
Figure 1C:
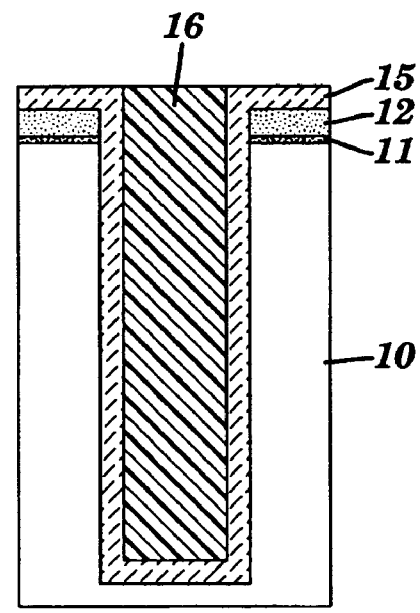
Figure 1D:
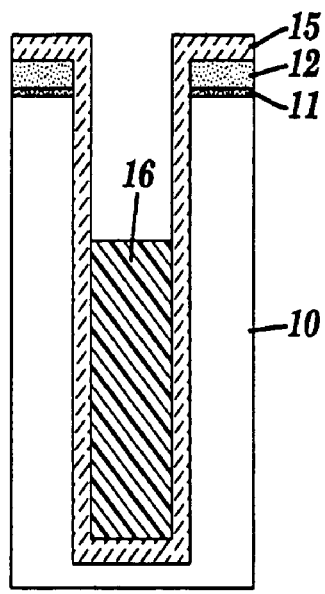
Figure 1E:
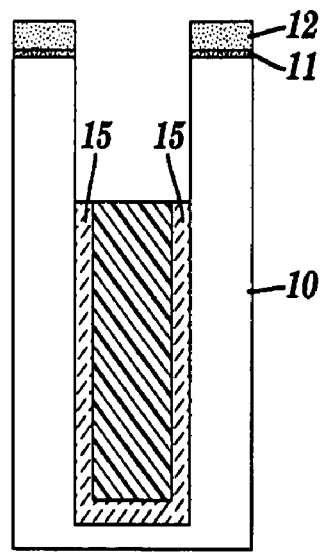
Figure 1F:
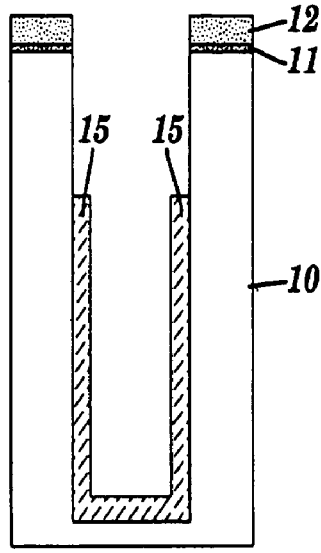

The prior art method begins with a substrate 10 having pad oxide 11 and pad nitride 12 thereon, as shown in FIG. 1(a). A trench 13 is formed in substrate 10. In FIG. 1(b), a layer of dopant source material 15 such as ASG is deposited on the trench bottom and sidewalls. The trench is then filled with a sacrificial material 16, as shown in FIG. 1(c). The sacrificial material 16 may be, for example, polysilicon, or a dielectric material such as oxide, or a resist material. The sacrificial material 16 is recessed in FIG. 1(d) to a level below the top of the trench, and then the exposed portions of the dopant source material 15 are removed by etching in FIG. 1(e), thereby exposing a top portion of the trench sidewalls. The remaining sacrificial material 16 is then removed from the trench, as shown in FIG. 1(f).

Figure 1G:
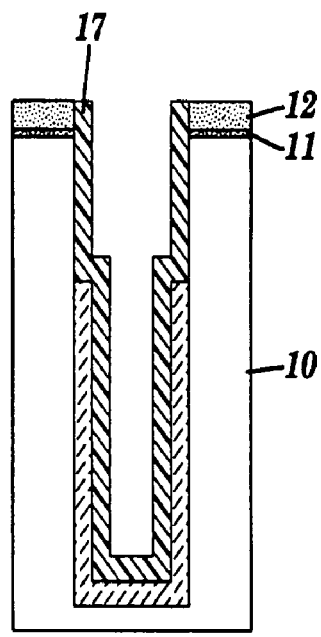
Figure 1H:
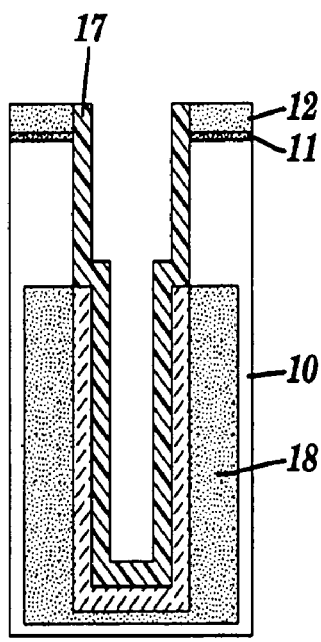
Figure 1I:
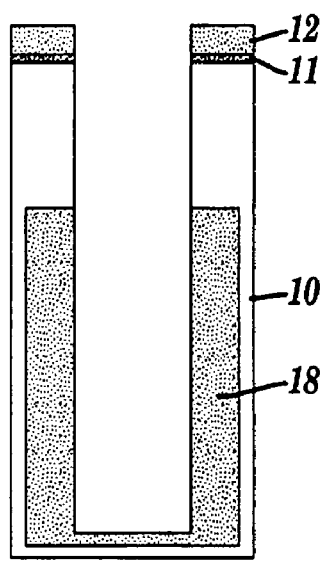

A dielectric collar material 17 such as undoped silicate glass (USG) is deposited on the sidewalls of the trench, as shown in FIG. 1(g). The drive-in of the dopant is then performed, typically by heating the substrate to cause the dopant to diffuse into the substrate, thereby forming buried plate 18, as shown in FIG. 1(h). Finally, the dielectric collar material 17 and dopant source material 15 are stripped from the trench, as shown in FIG. 1(i).

The method of the present invention provides a simpler, more effective integration scheme to form a buried plate and collar simultaneously. As compared to the prior art method shown in FIGS. 1(a)–1(i), the present invention has the following advantages. First, instead of relying on a thin dopant source layer on the trench sidewalls, the buried plate is formed by using a dopant source material which fills the trench completely, thus eliminating the problem of arsenic depletion. Second, the dielectric collar is formed after filling the trench with the dopant source material, thus eliminating the need to deposit multiple layers of films. The inherent limit on minimum trench size when using the conventional scheme is therefore relaxed significantly, and the method of the present invention is extendable to sub-100 nm generations.

A third advantage of the present invention relates to the shape of the trench. Trenches formed in substrate material such as silicon typically exhibit a hexagon-like shape. However, for better device performance and a wider process window, a trench with a rectangular shape is desired. A square shape may be achieved using a wet etching process which etches silicon at different rates depending on the crystalline orientation. With the method of the present invention, this shaping process can be performed after recess of the dopant source material, so only the upper trench is shaped while the lower trench is protected by the filled dopant source material. The lower trench therefore retains its original shape, thereby easing the node dielectric reliability concern caused by sharp corners in the lower trench, where the buried plates and node dielectric are formed.

One embodiment of the method of the present invention will now be described with reference to FIGS. 2(a)–2(i). The method begins with the structure shown in FIG. 2(a), which includes substrate 110, pad oxide 111 and pad nitride 112. A preferred material for substrate 110 is silicon, although various semiconductor materials such as gallium arsenide, germanium, silicon germanium or silicon-on-insulator (SOI) may be chosen to serve as the substrate 110. Substrate 110 optionally may be lightly doped with p-type dopants such as boron, especially if the buried plate is to be doped with n-type dopants such as arsenic. Pad oxide 111 is typically formed on the substrate 110 using thermal oxidation. Pad nitride 112 is formed on the pad oxide layer 111 to serve as a stopper of subsequent processes such as chemical mechanical polishing (CMP).

The pad nitride 112 may be formed by LPCVD or plasma-enhanced CVD (PECVD). A hardmask (not shown) such as boron-doped silicate glass (BSG) may be formed on pad nitride 112 by a CVD process. The hardmask, pad nitride 112 and pad oxide 111 are etched to define the trench pattern. The trench 113 is then formed in substrate 110. In a preferred embodiment, trench 113 is formed using a reactive ion etching (RIE) step is performed with $NF_3/HBr/O_2$ as the etchant chemistry. Alternatively, other etchants such as $SiCl_4/Cl_2$, $BCl_3/Cl_2$, or $SF_6/Br_2$ may be used to form the trench 113. The trench may have a depth of about 0.5 Åµm to about 10 Åµm, preferably about 7 to 8 Åµm.

Figure 2A:
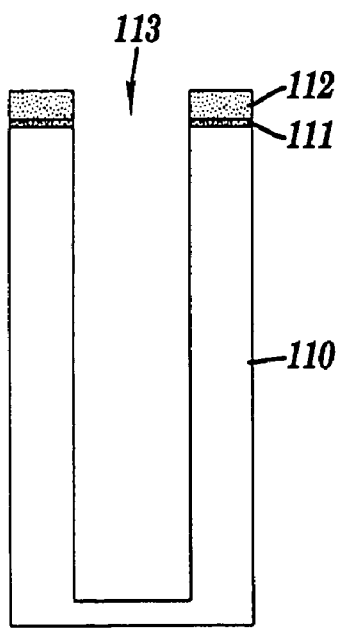
FIGS. 2($a$)–2($i$) illustrate one embodiment of the method of this invention for forming a buried plate in a trench capacitor.
Figure 2B:
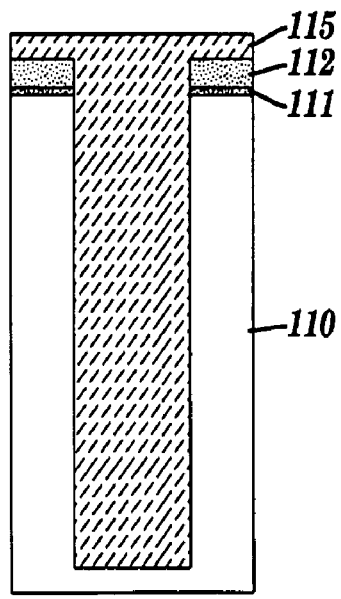

The trench 113 is then filled with a dopant source material 115, as shown in FIG. 2(b). The trench 113 may be filled using any suitable technique, more preferably using LPCVD or high-density plasma CVD (HDP CVD). Other suitable techniques include PECVD or spin-on techniques. If an n-type buried plate is desired, the dopant source material 115 may by any material containing n-type dopants, preferably arsenic or phosphorus. A particularly preferred dopant source material is arsenic-doped oxide glass (ASG). Other suitable materials include phosphorous-doped oxide glass, or arsenic- or phosphorous-doped polycrystalline silicon. If a p-type buried plate is desired, the dopant source material 115 may contain any p-type dopants, such as boron.

Figure 2C:
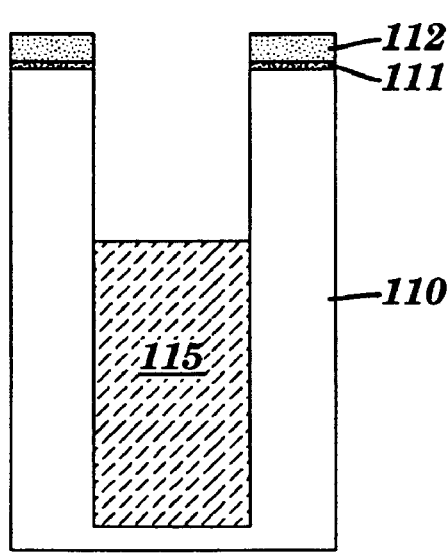

The top surface of the dopant source material 115 is then recessed to the desired depth of the buried plate, thereby exposing a top portion of the trench sidewall, as shown in FIG. 2(c). The dopant source material 115 may be recessed using a dry etch process such as reactive ion etch (RIE) in an environment containing carbon fluoride species such as $C_4F_6$, or by a wet etch process using HF species. The etch process should be chosen such that it etches oxide efficiently while being highly selective to silicon.

Following recess of the dopant source material 115, an optional trench top shaping step may be performed. This shaping process is designed to modify the shape of the upper portion of the trench from hexagon-like shape to rectangular for better device performance and a wider process window.

Figure 2D:
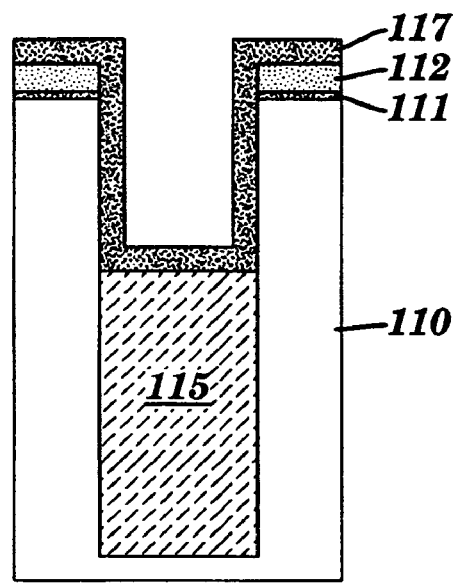
Figure 2E:
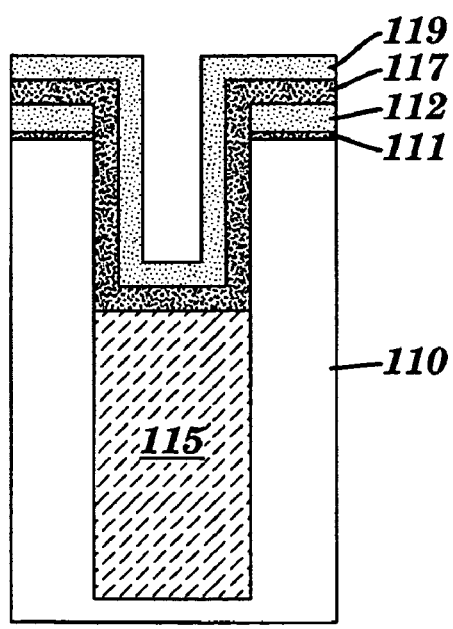
Figure 2F:
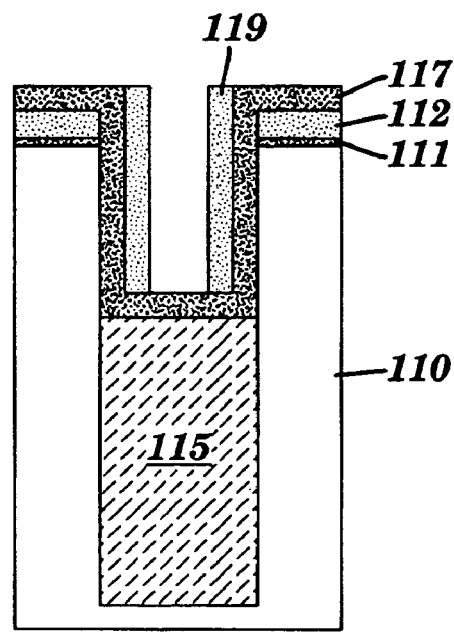
Figure 2G:
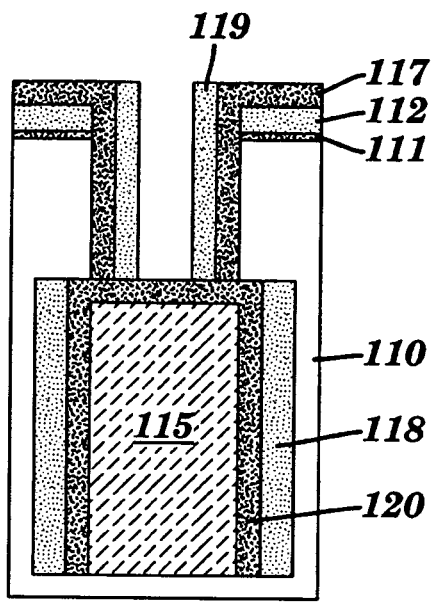
Figure 2H:
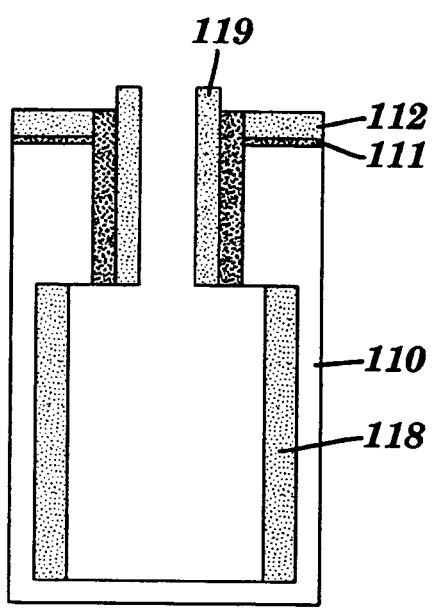
Figure 2I:
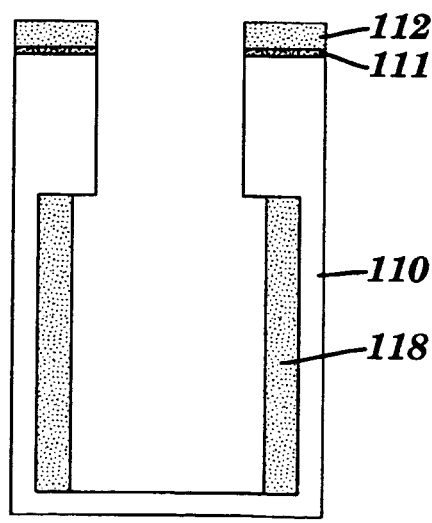

A thin layer of oxide 117 is optionally formed on the exposed top portion of the trench sidewall, as shown in FIG. 2(d). This thin layer of oxide enhances the adhesion of the collar 119 on the trench sidewall. It may also act as a buffer layer to release the stress due to direct contact of the collar on silicon. Oxide layer 117 may be formed by thermal growth or oxide deposition by LPCVD, HDP CVD, PECVD, spin-on technique, or any combination of these techniques. Alternatively, a thin layer of thermal nitride may be formed on the sidewall to promote good adhesion between the collar 119 and the trench sidewall.

The collar material 119 is then deposited on the top portion of the trench sidewall, as shown in FIG. 2(*e*). The collar material 119 may be any material which acts as a barrier to prevent doping in the trench top region. A preferred material for collar 119 is nitride. The collar 119 may be formed by any CVD process, preferably by LPCVD because of its good conformity and film quality.

In FIG. 2(*f*), a spacer etching step is performed to remove the collar material on top of the dopant material 115, leaving collar material 119 on the trench sidewall to form the collar 119. This step may be performed using any suitable spacer etch process, such as a conventional spacer RIE process. The collar 119 serves two purposes. First, it prevents oxidation of the trench sidewall in the collar region during the subsequent optional oxidation step shown in FIG. 2(*g*). Therefore, only the sidewall in the buried plate region is oxidized. A bottle shape is formed when this oxide is stripped along with the dopant source material. Second, during the drive-in process, the collar 119 prevents dopant diffusion into the collar region. Therefore, only the buried plate region 118 will be heavily doped.

The spacer etching step illustrated in FIG. 2(*f*) is optional for buried plate formation. If this step is not performed, buried plate can still be formed by outdiffusion of the dopant from the dopant material into the substrate during the drive-in step shown in FIG. 2(*g*). Without the spacer etching step, the collar materials on top of the dopant material 115 may block oxygen diffusion during drive-in process. The sidewall of the lower trench that covered by the dopant material 115 may not be oxidized efficiently during drive-in step. Consequently, the enlargement of the lower trench may be minimal. Moreover, skipping the spacer etching step may cause difficulty for performing trench capacitance enhancement such as hemispherical silicon grain (HSG). Therefore, the spacer etching step is preferred.

The next step in the method of this invention is the dopant drive-in, shown in FIG. 2(*g*), using a heat treatment in a manner well understood in the art to diffuse dopant from the dopant source 115 into the surface of the lower trench sidewalls to form the diffusion plates surrounding the lower portion of the trench. Preferably, the wafer is thermally annealed at a temperature of about 800 C to 1200 C, more preferably at about 1050 C, for about 1 to 60 minutes. The dopant is driven in to the substrate 110 in the lower portion of the trench, forming buried plate 118. The nitride collar 119 on the upper portion of the trench acts as a hardmask to prevent the dopant from diffusing into the upper region. The annealing environment may contain oxygen, nitrogen, hydrogen, argon, or any combination of these. If oxygen is present, the sidewall of the lower portion of the trench will be oxidized to form oxide 120.

In the next step, shown in FIG. 2(*h*), the oxide 120 and the dopant source material 115 are stripped by, for example, a conventional wet process with HF species. The etch chemistry may include buffered HF (BHF), dilute HF (DHF) or concentrated HF. Alternatively, the oxide may be stripped by a conventional dry etch process. Note that the trench surface area is enlarged following oxide strip, thereby enhancing trench capacitance. Other trench capacitance enhancement approaches also may be practiced at this point in the process, such as formation of HSG in the lower trench region that is not covered by the collar 119, wet or dry etching the lower trench that is not covered by the collar 119 to form a bottle-shape in the lower trench, gas phase doping (GPD), plasma doping, plasma immersion ion implantation, or any combination of these approaches. The etchant for wet etching the substrate may contain ammonia, KOH, or HF:HNO$_3$:CH$_3$COOH. The use of KOH may cause K contamination, so an additional cleaning step may be required. The etchant for dry etching the substrate may contain Cl$_2$ plasma.

Finally, the collar 119 is stripped, as shown in FIG. 2(*i*). In a preferred embodiment in which nitride is used as the collar material, the nitride collar 119 may be stripped by any suitable technique, including a mixture of HF and ethylene glycol (HF/EG), or hot phosphoric acid (H$_3$PO$_4$). If an oxide liner 117 is present under collar 119, it also may be stripped by any suitable technique, such as a conventional wet etch using HF species.

In the embodiment without the spacer etching step, the collar 119 is stripped before removing the dopant source material 115 from the trench.

Figure 3E:
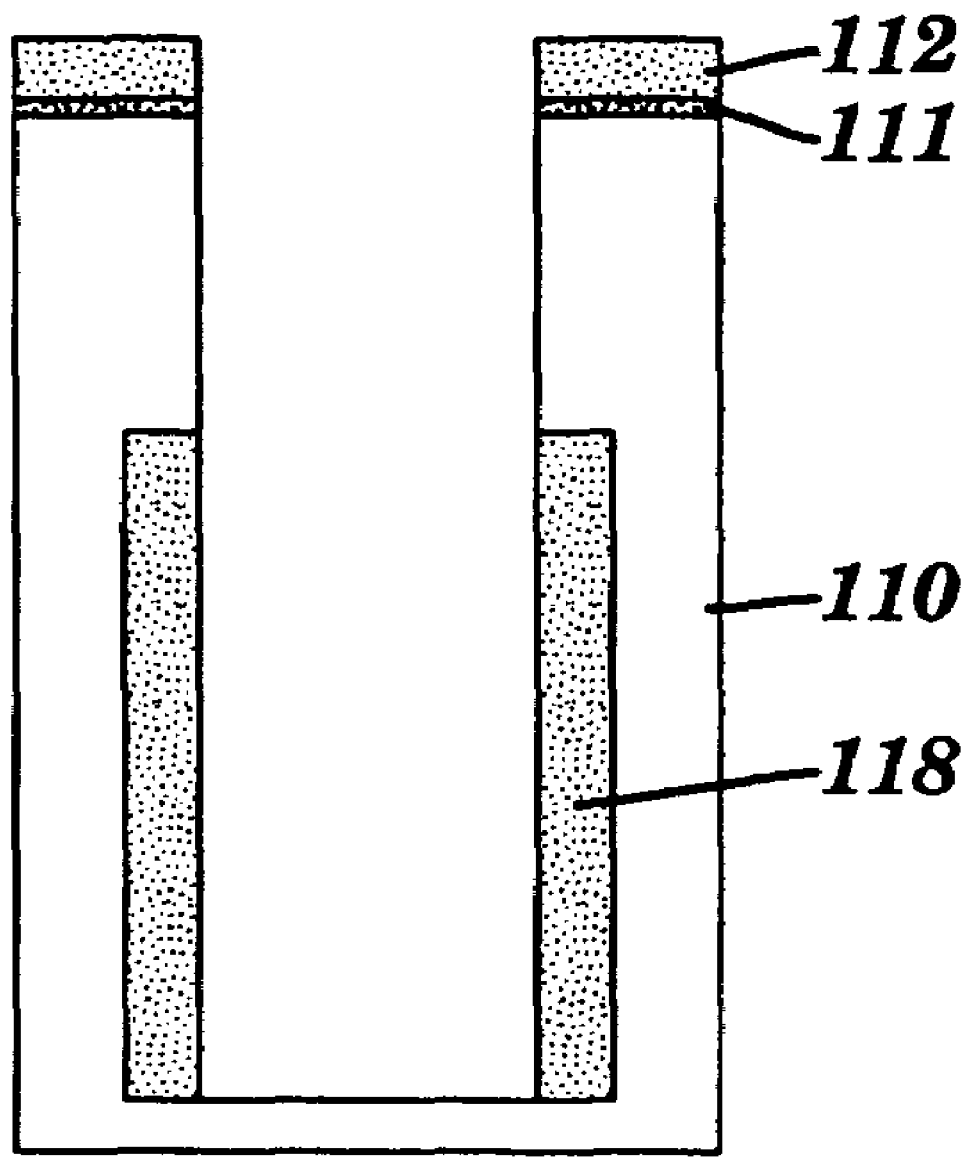

An alternative embodiment of the method is shown in FIGS. 3(*a*)–3(*e*). Again, the method begins with the structure shown in FIG. 3(*a*), includes substrate 110, pad oxide 111 and pad nitride 112. A hardmask (not shown) may be formed on pad nitride 112 by a CVD process. The hardmask, pad nitride 112 and pad oxide 111 are etched to define the trench pattern. The trench 113 is then formed in substrate 110. The trench 113 is then filled with a dopant source material 115, as shown in FIG. 3(*b*). The top surface of the dopant source material 115 is then recessed to the desired depth of the buried plate, thereby exposing a top portion of the trench sidewall, as shown in FIG. 3(*c*).

The top portion of the trench is then filled with a second material 121, as shown in FIG. 3(*d*). The second material 121 is preferably un-doped oxide, but also may be un-doped nitride, oxynitride, silicon carbide, polysilicon, or any combination of these materials. The second material 121 may be deposited by any suitable method, but is preferably deposited using low pressure chemical vapor deposition (LPCVD) or high density plasma chemical vapor deposition (HDP CVD).

A heat treatment or thermal process is then employed to cause the dopant to diffuse into the surface of the lower trench sidewalls to form the diffusion plates 118 surrounding the lower portion of the trench. The second material 121 and the dopant source material 115 are then removed from the trench, as shown in FIG. 3(*e*).

The method of this invention provides a simpler but more effective bottle and buried plate formation scheme which does not require multiple layers of films, thus significantly relaxing the limitation on minimum trench size. This scheme can therefore be extended to the next several generations of trench DRAM technology, including sub-100 nm generations. Other advantages of this method include: suppressed trench top enlargement, compatibility with all capacitance enhancement approaches, and elimination of the disadvantages of the modified anti-collar and sacrificial poly schemes.

While the present invention has been particularly described in conjunction with a specific preferred embodiment and other alternative embodiments, it is evident that numerous alternatives, modifications and variations will be apparent to those skilled in the art in light of the foregoing description. It is therefore intended that the appended claims embrace all such alternatives, modifications and variations as falling within the true scope and spirit of the present invention.

What is claimed is:

1. A method for forming a buried plate in a trench capacitor, the method comprising the steps of:
   forming at least one trench with a sidewall in a semiconductor substrate;
   non-conformally partially filling the trench with a dopant source material to form a dopant source having a top surface below a top of the trench, the dopant source material containing at least one dopant;
   covering the sidewall of the trench above the dopant source with a second material;
   heating the substrate to cause the dopant to diffuse into the substrate in the trench not covered by the second material, thereby forming the buried plate;
   wet etching the trench such that the cross section of the upper portion of the trench is squared while the lower portion of the trench is protected by the dopant source material; and
   removing the dopant source material from the trench.

2. The method of claim 1, wherein the semiconductor substrate is formed of silicon.

3. The method of claim 1, wherein the dopant source material is arsenic-doped glass.

4. The method of claim 1 wherein said filling is such that at least one cross-section of said dopant source material substantially perpendicular to said sidewall at or near said top surface of said dopant source material is non-annular.

5. The method of claim 1 wherein said filling is such that at least one cross-section of said dopant source material substantially perpendicular to said sidewall closer to said top surface of said dopant source material than to a bottom of said trench is non-annular.

6. A method for forming a buried plate in a trench capacitor the method comprising the steps of:
   forming at least one trench with a sidewall in a semiconductor substrate;
   non-conformally filling the trench with a dopant source material to form a dopant source having a top surface at or above a top of the trench;
   recessing the top surface of the dopant source below the top of the trench;
   covering the sidewall of the trench above the dopant source with a second material;
   heating the substrate to cause the dopant to diffuse into the substrate in the trench not covered by the second material, thereby forming the buried plate;
   wet etching the trench such that the cross section of the upper portion of the trench is squared while the lower portion of the trench is protected by the dopant source material; and
   removing the dopant source material from the trench.

7. The method of claim 6, wherein the sidewall of the trench is covered by forming a dielectric collar on the sidewall above the dopant source.

8. The method of claim 7, wherein the dielectric collar is formed of nitride.

9. The method of claim 8, wherein the dielectric collar is formed by low pressure chemical vapor deposition.

10. The method of claim 8, further comprising the step of forming a thin layer of oxide on the sidewall of the trench prior to forming the dielectric collar.

11. The method of claim 6, wherein the substrate is heated to a temperature of about 800 C to about 1200 C, for a time of about 1 to about 60 minutes.

12. The method of claim 11, wherein the substrate is heated to a temperature of about 1050 C.

13. The method of claim 6, wherein the substrate is heated in an oxygen-containing atmosphere.

14. The method of claim 6, further comprising the step of depositing a plurality of hemispherical grains in the trench after the dopant source material is removed.

15. The method of claim 14, further comprising the step of exposing the substrate to at least one of gas phase doping, plasma doping and plasma immersion ion implantation, after depositing a plurality of hemispherical grains.

16. The method of claim 6, further comprising the step of removing the second material.

17. The method of claim 6, further comprising the step of etching the substrate in the lower portion to form a bottle shape trench after the dopant source material is removed.

18. The method of claim 17, wherein the substrate is etched using ammonia.

19. The method of claim 6, wherein the sidewall of the trench is covered by depositing the second material on the dopant source, thereby filling the remainder of the trench and covering the sidewall of the trench above the dopant source.

20. The method of claim 19, wherein the second material is un-doped oxide.

21. The method of claim 20, wherein the second material is deposited by low pressure chemical vapor deposition or high density plasma chemical vapor deposition.

22. The method of claim 6, further comprising the step of exposing the substrate to at least one of gas phase doping, plasma doping and plasma immersion ion implantation.

23. The method of claim 6 wherein said filling and recessing are such that at least one cross-section of said dopant source material substantially perpendicular to said sidewall at or near said top surface of said dopant source material is non-annular.

24. The method of claim 6 wherein said filling and recessing such that at least one cross-section of said dopant source material substantially perpendicular to said sidewall closer to said top surface of said dopant source material than to a bottom of said trench is non-annular.

25. A method for forming a buried plate in a trench capacitor, the method comprising the steps of:
   forming at least one trench with a sidewall in a semiconductor substrate;
   partially filling the trench with a dopant source material to form a dopant source having a top surface below a top of the trench, the dopant source material containing at least one dopant;
   covering the sidewall of the trench above the dopant source with a second material;
   heating the substrate to cause the dopant to diffuse into the substrate in the trench not covered by the second material, thereby forming the buried plate, wherein the substrate is heated in an oxygen-containing atmosphere, and wherein during the heating step, a layer of oxide is grown between the dopant source material and the substrate; and
   removing the dopant source material from the trench.

26. The method of claim 25, further comprising the step of removing the layer of oxide, thereby forming a bottle-shaped trench.

* * * * *